United States Patent
Ishiguro et al.

(10) Patent No.: US 9,583,468 B2
(45) Date of Patent: Feb. 28, 2017

(54) LIGHT-EMITTING PART AND LIGHT-EMITTING APPARATUS, AND PRODUCTION METHODS THEREFOR

(71) Applicant: TOYODA GOSEI CO., LTD., Kiyosu-shi (JP)

(72) Inventors: Yuya Ishiguro, Kiyosu (JP); Kosuke Yahata, Kiyosu (JP); Naoki Arazoe, Kiyosu (JP); Tetsuya Matsutani, Kiyosu (JP)

(73) Assignee: TOYODA GOSEI CO., LTD., Kiyosu-shi, Aichi-ken (JP)

( * ) Notice: Subject to any disclaimer, the term of this patent is extended or adjusted under 35 U.S.C. 154(b) by 0 days.

(21) Appl. No.: 14/569,461

(22) Filed: Dec. 12, 2014

(65) Prior Publication Data
US 2015/0187839 A1    Jul. 2, 2015

(30) Foreign Application Priority Data

Dec. 26, 2013 (JP) .................................. 2013-269136

(51) Int. Cl.
H01L 25/075 (2006.01)
H01L 33/62 (2010.01)

(52) U.S. Cl.
CPC .......... *H01L 25/0753* (2013.01); *H01L 33/62* (2013.01); *H01L 2224/48091* (2013.01);
(Continued)

(58) Field of Classification Search
CPC ....... H01L 2224/48137; H01L 25/0753; H01L 2933/0066; H01L 33/62
See application file for complete search history.

(56) References Cited

U.S. PATENT DOCUMENTS

2007/0063213 A1*  3/2007  Hsieh .................. H01L 25/0753
                                                                257/99
2008/0017871 A1*  1/2008  Lee ...................... H01L 25/0753
                                                                257/88
(Continued)

FOREIGN PATENT DOCUMENTS

JP    2005-310925 A    11/2005
JP    2008-505478       2/2008
(Continued)

OTHER PUBLICATIONS

Japanese Office Action dated Oct. 4, 2016 with a partial English translation.

*Primary Examiner* — Bilkis Jahan
*Assistant Examiner* — Victor Barzykin
(74) *Attorney, Agent, or Firm* — McGinn IP Law Group, PLLC

(57) ABSTRACT

The present invention provides a light-emitting part and a light-emitting apparatus exhibiting high brightness per unit area, and simplified production methods therefor. The light-emitting unit comprises a single base substrate, and a plurality of light-emitting devices thereon. The light-emitting unit includes a serial connection body which connects at least a part of the light-emitting devices in series. The serial connection body comprises light-emitting devices which make a current path, a light-emitting device which does not make a current path, and a connection member which electrically connects an n-electrode and a p-electrode of the light-emitting devices.

9 Claims, 5 Drawing Sheets

(52) U.S. Cl.
CPC ............... *H01L 2224/48111* (2013.01); *H01L 2224/48137* (2013.01); *H01L 2933/0016* (2013.01); *H01L 2933/0041* (2013.01); *H01L 2933/0066* (2013.01)

(56) References Cited

U.S. PATENT DOCUMENTS

| | | | | |
|---|---|---|---|---|
| 2010/0134176 A1* | 6/2010 | Brandes | ................ | H01L 25/167 327/526 |
| 2011/0210352 A1* | 9/2011 | Lee | ........................ | H01L 27/156 257/93 |
| 2012/0080713 A1* | 4/2012 | Agatani | .............. | H01L 25/0753 257/99 |

FOREIGN PATENT DOCUMENTS

| | | |
|---|---|---|
| JP | 2008-235721 | 10/2008 |
| JP | 2010-225604 | 10/2010 |
| JP | 2012-195437 A | 10/2012 |

\* cited by examiner

LIGHT-EMITTING PART AND LIGHT-EMITTING APPARATUS, AND PRODUCTION METHODS THEREFOR

BACKGROUND OF THE INVENTION

Field of the Invention

The present invention relates to a light-emitting part having light-emitting devices and a light-emitting apparatus, and production methods therefor.

Background Art

A process for producing a semiconductor light-emitting device may comprise growing semiconductor layers on a growth substrate, and dividing a growth substrate into a plurality of light-emitting devices.

For example, dividing into light-emitting devices having Group III nitride semiconductor may comprise steps of thinning a sapphire wafer by grinding, forming a modified portion inside the sapphire wafer by irradiating laser, and dividing the sapphire wafer into light-emitting devices. In this way, a lot of steps are required.

As shown in FIG. 1 of Japanese Patent Application Laid-Open (kokai) No. 2012-195437, a plurality of light-emitting devices is generally connected in series in the light-emitting apparatus. Therefore, even one light-emitting device with poor electrical characteristics may prevent current from flowing to other light-emitting devices. To avoid this, after the divided light-emitting devices are usually inspected one by one, only the light-emitting devices that satisfied a predetermined standard are assembled to the light-emitting apparatus.

To assemble a plurality of light-emitting devices, a certain distance (space) needs to be provided between the light-emitting devices. Such distance between devices makes it difficult to dispose a plurality of light-emitting devices concentrated. As a distance between devices increases, brightness per unit area of the light-emitting apparatus is reduced. A distance between devices may obstruct downsizing of the light-emitting apparatus.

The number of steps is increased by the steps of isolating light emitting devices from each other and rearranging light-emitting devices. Thus, the cycle time is a little longer.

SUMMARY OF THE INVENTION

The present invention has been accomplished for solving problems involved in the aforementioned conventional techniques. Accordingly, an object of the present invention is to provide a light-emitting part and a light-emitting apparatus exhibiting high brightness per unit area, and simplified production methods therefor.

In a first aspect of the present invention, there is provided a light-emitting part comprising a single base substrate, and a plurality of light-emitting devices on the single base substrate. The light-emitting part includes serial connection bodies which connect at least a part of the light-emitting devices in series. Each of the light-emitting devices includes a semiconductor layer comprising a first conductive type first semiconductor layer, a light-emitting layer, and a second conductive type second semiconductor layer, a first electrode electrically connected to the first semiconductor layer, and a second electrode electrically connected to the second semiconductor layer. Each serial connection body comprises a first light-emitting device and a second light-emitting device which make a current path, and a third light-emitting device which does not make a current path, and a connection member which electrically connects the first electrode of the first light-emitting device and the second electrode of the light-emitting device.

In the light-emitting part, no excessive space is required when disposing the light-emitting devices on a base substrate. No cutting allowance is required when cutting a growth substrate to separate the light-emitting devices. Therefore, the light-emission amount per unit area of the light-emitting part is higher than that of the conventional light-emitting part. In other words, the light-emitting part can be reduced in size. Moreover, the productivity of the light-emitting part can be increased. Hereinafter, "a light-emitting device which does not make a current path" includes a case when at least one of the first electrode and the second electrode of the light-emitting device is not electrically connected to a power source, and a case when the first electrode and the second electrode of the light-emitting device are connected by a conductor. When the first electrode and the second electrode of the light-emitting device are connected by a conductive member, i.e., short-circuited, current hardly flows to the light-emitting device, and current flows to the conductive member.

A second aspect of the present invention is drawn to a specific embodiment of the light-emitting part, wherein the base substrate is a growth substrate to grow semiconductor layers of the light-emitting devices, each of the light-emitting devices are isolated from each other by a groove formed on the surface of the growth substrate.

A third aspect of the present invention is drawn to a specific embodiment of the light-emitting part, wherein each of the light-emitting devices comprises a buffer layer formed on the single base substrate, which is insulated and isolated each other and on which the semiconductor layers are grown. Also a plurality of light-emitting devices has a buffer layer. A plurality of light-emitting devices is disposed on a single base substrate on which the buffer layer is contacted.

A fourth aspect of the present invention is drawn to a specific embodiment of the light-emitting part, wherein the first electrode and the second electrode of the light-emitting devices have respective exposed portions on one surface viewed from the semiconductor layer.

A fifth aspect of the present invention is drawn to a specific embodiment of the light-emitting part, wherein, in the serial connection body, the ratio of the internal resistance of the third light-emitting device to the average internal resistance of the light-emitting devices other than the third light-emitting device is within a range of 0.98 or less, or a range of 1.02 or more.

A sixth aspect of the present invention is drawn to a specific embodiment of the light-emitting part, wherein, in the serial connection body, the ratio of the driving voltage of the third light-emitting device to the average driving voltage of the light-emitting devices other than the third light-emitting device is within a range of 0.98 or less, or a range of 1.02 or more.

A seventh aspect of the present invention is drawn to a specific embodiment of the light-emitting part, wherein, in the serial connection body, the ratio of the total radiant flux of the third light-emitting device to the average total radiant flux of the light-emitting devices other than the third light-emitting device is within a range of 0.98 or less, or a range of 1.02 or more.

An eighth aspect of the present invention is drawn to a specific embodiment of the light-emitting part, wherein the third light-emitting device is disposed between the first light-emitting device and the second light-emitting device in the serial connection body.

A ninth aspect of the present invention is drawn to a specific embodiment of the light-emitting part, wherein the third light-emitting device is disposed at least one end of the serial connection body.

A tenth aspect of the present invention is drawn to a specific embodiment of the light-emitting part, wherein the third light-emitting device does not include a connection member which is electrically connected to at least one of the first electrode of the third light-emitting device and the second electrode of the third light-emitting device.

An eleventh aspect of the present invention is drawn to a specific embodiment of the light-emitting part, wherein the third light-emitting device includes a conductive member which is electrically connected to the first electrode of the third light-emitting device and the second electrode of the third light-emitting device.

A twelfth aspect of the present invention is drawn to a specific embodiment of the light-emitting part, wherein a single base substrate is a growth substrate for growing semiconductor layers of the light-emitting devices.

In a thirteenth aspect of the present invention, there is provided a light-emitting apparatus comprising the above mentioned light-emitting part, and a fluorescent material which covers at least a part of the surfaces of the light-emitting devices of the light-emitting part.

In a fourteenth aspect of the present invention, there is provided a method for producing a light-emitting part. The method comprises growing a semiconductor layer comprising a first conductive type first semiconductor layer, a light-emitting layer, a second conductive type second semiconductor layer on a growth substrate, and forming a first electrode on the first semiconductor layer and a second electrode on the second semiconductor layer. The method further comprises, forming grooves to insulate and isolate the semiconductor layers into a plurality of light-emitting devices and electrically connecting the first electrode of a first light-emitting device and the second electrode of a second light-emitting device, wherein a third light-emitting device being at least a part of the light-emitting devices does not make a current path.

A fifteenth aspect of the present invention is drawn to a specific embodiment of the method for producing a light-emitting part, wherein the third light-emitting device is not electrically connected.

A sixteenth aspect of the present invention is drawn to a specific embodiment of the method for producing a light-emitting part, wherein the first electrode and the second electrode of the third light-emitting device are electrically connected by a conductive member.

A seventeenth aspect of the present invention is drawn to a specific embodiment of the method for producing a light-emitting part, further comprising mounting the light-emitting part on a sub-mount.

An eighteenth aspect of the present invention is drawn to a specific embodiment of the method for producing a light-emitting part, further comprising producing the above light-emitting part, and applying fluorescent coating to the light-emitting devices of the light-emitting part.

A nineteenth aspect of the present invention is drawn to a specific embodiment of the method for producing a light-emitting part, further comprising producing the above light-emitting part, wherein the growth substrate is a sapphire substrate, and applying fluorescent coating to a light output surface of the sapphire substrate.

According to the present invention, there is provided a light-emitting part and a light-emitting apparatus exhibiting high brightness per unit area, and simplified production methods therefor.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Figure 1:
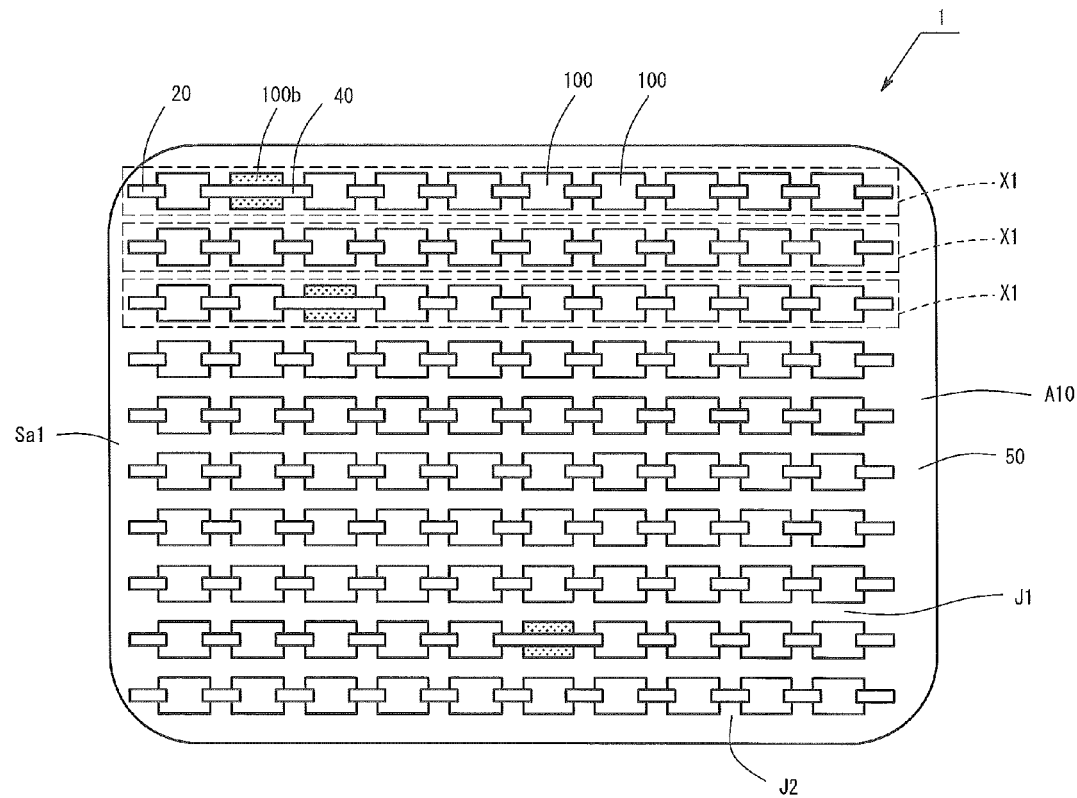
FIG. 1 is a plan view showing a light-emitting apparatus according to Embodiment 1.

Specific embodiments of the present invention will next be described with reference to the drawings by taking, as an example, a light-emitting apparatus having a semiconductor light-emitting device. However, the present invention is not limited to these embodiments. In the below-described semiconductor light-emitting device, the layered structure of each layer or the structure of each electrode are shown for an exemplary purpose. Needless to say, the layered structure may differ from that described below in the embodiments. The thickness of each layer is schematically shown in the drawings.

Embodiment 1

1. Light-Emitting Apparatus and Light-Emitting Unit

Figure 2:
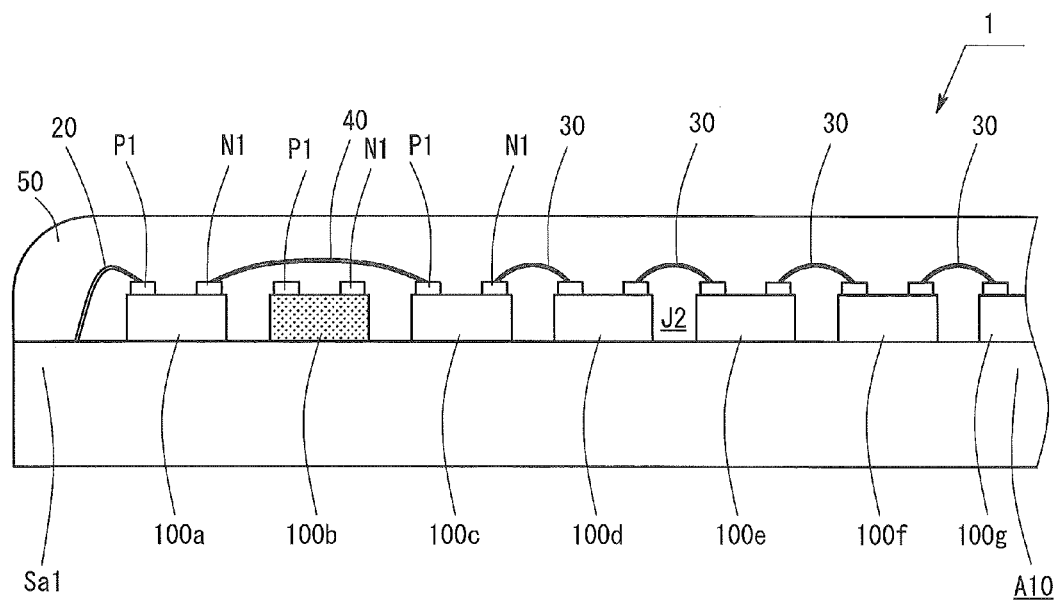
FIG. 2 is a schematic structure diagram of the light-emitting apparatus according to Embodiment 1 viewed from the side.

FIG. 1 is a plan view showing a light-emitting apparatus 1 according to Embodiment 1. FIG. 2 is a schematic structure diagram of the light-emitting apparatus viewed from the side. As shown in FIGS. 1 and 2, the light-emitting apparatus 1 comprises a light-emitting unit A10 having a plurality of light-emitting devices 100, and a fluorescent material 50. The fluorescent material 50 covers at least a part of the surfaces of the light-emitting devices 100. Specifically, the fluorescent material 50 covers the entire light-emitting surfaces of the light-emitting devices 100.

The light-emitting unit A10 is a light-emitting part having one base substrate Sa1, and a plurality of light-emitting devices 100. The base substrate Sa1 is a sapphire substrate. The base substrate Sa1 is also a growth substrate on which semiconductor layers of the light-emitting devices 100 grow.

As shown in FIG. 1, the light-emitting unit A10 includes a plurality of serial connection bodies X1. In each serial connection body X1, at least a part of the light-emitting devices 100 is connected in series. Therefore, in FIG. 1 and FIG. 2, each serial connection body X1 comprises ten light-emitting devices 100, a wiring 20, a connection member 30, and a connection member 40. Each serial connection body X1, as described later, includes light-emitting devices 100a, 100c, etc., which makes a current path, and a light-emitting device 100b which does not make a current path. In FIG. 1, the serial connection bodies X1 have not been electrically connected each other. When connecting the light-emitting apparatus 1 to a power source, ten serial connection bodies X1 are connected in parallel.

The wiring 20 is to connect the serial connection body X1 to the power source. The connection member 30 is to electrically connect one light-emitting device 100 to its adjacent light-emitting device 100.

In FIG. 2, alphabets a to g are respectively assigned to each light-emitting device 100 according to its position. The connection member 40 connects an n-electrode N1 of the light-emitting device 100a and a p-electrode P1 of the light-emitting device 100c. As described later, the connection member 40 is to electrically connect not the light-emitting device 100b with poor electrical characteristics or light-emitting characteristics but the light-emitting device 100a and the light-emitting device 100c on both sides of the light-emitting device 100b.

2. Alignment of a Plurality of Light-Emitting Devices on Single Base Substrate 2-1. Good Light-Emitting Device The light-emitting devices 100a, and 100c to 100g, have good electrical characteristics. The n-electrode N1 of the light-emitting device 100a and the p-electrode P1 of the light-emitting device 100c are electrically connected via the connection member 40. The light-emitting device 100a and the light-emitting device 100c make a current path. Similarly, the light-emitting devices 100c to 100g are connected via the connection member 30. Thus, the light-emitting devices 100c to 100g make a current path.

2-2. Defective Light-Emitting Device

On the other hand, the light-emitting device 100b has poor electrical characteristics or light-emitting characteristics. The light-emitting device 100b is disposed between the light-emitting device 100a and the light-emitting device 100c with good characteristics. The light-emitting device 100b does not include the connection members 30 and 40. That is, at least one of the n-electrode N1 and the p-electrode P1 of the light-emitting device 100b is not connected with the connection member 30 or 40. Thus, the light-emitting device 100b of the light-emitting devices 100 does not make a current path.

2-3. Alignment of Light-Emitting Device on Base Substrate

Figure 3:
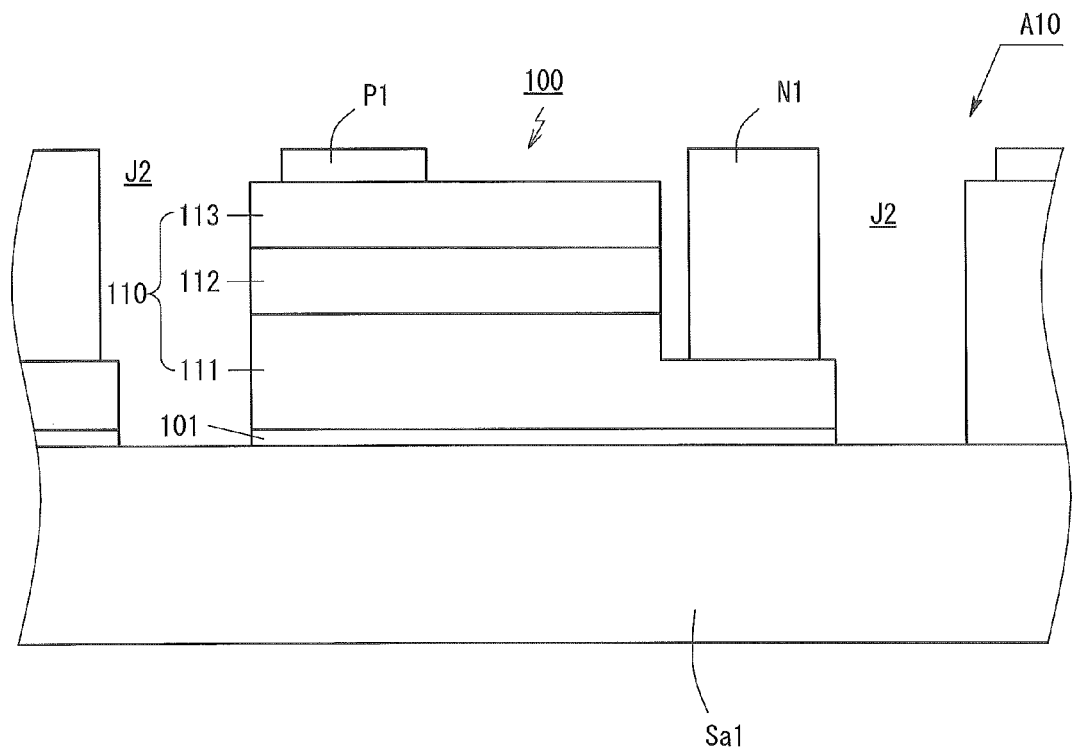
FIG. 3 is a schematic structure diagram of light-emitting device of light-emitting apparatus according to Embodiments.

As shown in FIG. 3, each light-emitting device 100 includes a buffer layer 101, a semiconductor layer 110, a p-electrode P1, and an n-electrode N1. The semiconductor layer 110 comprises an n-type semiconductor layer 111, a light-emitting layer 112, and a p-type semiconductor layer 113. Each of them is formed of Group III nitride semiconductor. The n-type semiconductor layer 111 is a first conductive type first semiconductor layer. The p-type semiconductor layer 113 is a second conductive type second semiconductor layer.

The n-electrode N1 is a first electrode. The n-electrode N1 is formed on the n-type semiconductor layer 111. Therefore, the n-electrode N1 is electrically connected to the n-type semiconductor layer 111. The p-electrode P1 is a second electrode. The p-electrode P1 is formed on the p-type semiconductor layer 113. Therefore, the p-electrode P1 is electrically connected to the p-type semiconductor layer 113. The p-electrode P1 and the n-electrode N1 are respectively exposed on one surface of the semiconductor layer 110, i.e., the surface opposite to the base substrate Sa1.

Here, the base substrate Sa1 is common to all the light-emitting devices 100 which constitute the light-emitting apparatus 1. The respective light-emitting devices 100 are isolated from each other by a groove J1 and a groove J2, each of which functions as a separate light-emitting device. That is, the respective light-emitting devices 100 are isolatedly disposed on the single base substrate Sa1.

Thus, the light-emitting unit A10 includes the connection members 30 and 40 which electrically connect the n-electrode N1 of the first light-emitting device 100 and the p-electrode P1 of the second light-emitting device 100. Such electrical connection is made, for example, by wire bonding. That is, the light-emitting unit A10 has a plurality of light-emitting devices 100 and the connection members 30 and 40 using wire bonding.

3. Differences Between Good Light-Emitting Device and Defective Light-Emitting Device Differences between good light-emitting device and defective light-emitting device in a plurality of light-emitting devices 100 are described. Here, internal resistance, driving voltage, and total radiant flux are taken as examples. Defective light-emitting device is different from good light-emitting device in at least one or more of them. For convenience of description, the light-emitting devices 100a, and 100c to 100g are good, and the light-emitting device 100b is defective in the serial connection body X1.

3-1. Internal Resistance

Electric resistance of the light-emitting device, i.e., internal resistance is compared between the light-emitting device 100b and the light-emitting devices 100a, and 100c to 100g. An internal resistance R1 is the internal resistance of the light-emitting device 100b. Internal resistance Rm is the average internal resistance of the light-emitting devices 100a, and 100c to 100g. A ratio Y1 is a ratio of the internal resistance R1 to the internal resistance Rm, which satisfies the following formula:

$$Y1 = R1/Rm$$

The ratio Y1 is 1.02 or more. In other words, the internal resistance R1 of the light-emitting device 100b is 1.02 times the internal resistance Rm of good light-emitting devices.

On the contrary, when the ratio Y1 is 0.98 or less, an unexpected current path may be formed in the light-emitting device 100b. Therefore, the light-emitting device 100b, preferably, does not make a current path. Thus, when the ratio Y1 of the internal resistance R1 of the light-emitting device 100b to the internal resistance Rm of the light-emitting devices 100a, and 100c to 100g is within a range of 0.98 or less, or a range of 1.02 or more, the light-emitting device 100b can be decided as a defective light-emitting device. Accordingly the ranges can be a reference to select the defective (no good) light-emitting device 100b.

3-2. Driving Voltage

Next, driving voltage is compared between the light-emitting device 100b and the light-emitting devices 100a, and 100c to 100g. A driving voltage V1 is a driving voltage of the light-emitting device 100b. A driving voltage Vm is the average driving voltage of the light-emitting devices 100a, and 100c to 100g. A ratio Y2 is a ratio of the driving voltage V1 to the driving voltage Vm, which satisfies the following formula:

$$Y2=V1/Vm$$

The ratio Y2 is 1.02 or more. In other words, the driving voltage V1 of the light-emitting device 100b is 1.02 times the driving voltage Vm of good light-emitting devices.

On the contrary, when the ratio Y2 is 0.98 or less, an unexpected current path may be formed in the light-emitting device 100b. Therefore, the light-emitting device 100b, preferably, does not make a current path. Thus, when the ratio Y2 of the driving voltage V1 of the light-emitting device 100b to the driving voltage Vm of the light-emitting devices 100a, and 100c to 100g is within a range of 0.98 or less, or a range of 1.02 or more, the light-emitting device 100b can be decided as a defective light-emitting device. Accordingly the ranges can be a reference to select the defective (no good) light-emitting device 100b.

3-3. Total Radiant Flux

Next, total radiant flux is compared between the light-emitting device 100b and the light-emitting devices 100a, and 100c to 100g. A total radiant flux K1 is a total radiant flux when the light-emitting device 100b emits light. A total radiant flux Km is the average total radiant flux of the light-emitting devices 100a, and 100c to 100g. A ratio Y3 is a ratio of the total radiant flux K1 to the total radiant flux Km, which satisfies the following formula:

$$Y3=K1/Km$$

The ratio Y3 is 1.02 or more. In other words, the total radiant flux K1 of the light-emitting device 100b is 1.02 times the total radiant flux Km of good light-emitting devices.

On the contrary, when the ratio Y3 is 0.98 or less, an unexpected current path may be formed in the light-emitting device 100b. Therefore, the light-emitting device 100b, preferably, does not make a current path. Thus, when the ratio Y3 of the total radiant flux K1 of the light-emitting device 100b to the total radiant flux Km of the light-emitting devices 100a, and 100c to 100g is within a range of 0.98 or less, or a range of 1.02 or more, the light-emitting device 100b can be decided as a defective light-emitting device. Accordingly the ranges can be a reference to select the defective (no good) light-emitting device 100b.

3-4. Dominant Wavelength

Dominant wavelength is compared between the light-emitting device 100b and the light-emitting devices 100a, and 100c to 100g. A ratio Y4 of a dominant wavelength 21 of the light-emitting device 100b to the average dominant wavelength km of the light-emitting devices 100a, and 100c to 100g is 0.995 or less, or 1.005 or more. In this case, the light-emitting device 100b is judged as defective.

3-5. Reverse Current

Reverse current is compared between the light-emitting device 100b and the light-emitting devices 100a, and 100c to 100g. This reverse current is a value of reverse current which flows through the light-emitting device 100 when a reverse voltage is applied to the light-emitting device 100. A ratio Y5 of a reverse current I1 of the light-emitting device 100b to a reverse current Im of the light-emitting devices 100a, and 100c to 100g is 5 or more. In this case, the light-emitting device 100b is judged as defective.

4. Production Method for Light-Emitting Apparatus 4-1. Forming Semiconductor Layer A buffer layer 101 is formed on a base substrate Sa1. Subsequently, an n-type semiconductor layer 111, a light-emitting layer 112, and a p-type semiconductor layer 113 are formed in this order on the buffer layer 101. In this step, Metal Organic Chemical Vapor Deposition (MOCVD) may be employed.

4-2. Forming Electrodes

Next, a part of the n-type semiconductor layer 111 is exposed by forming a non-through hole from the p-type semiconductor layer 113. An n-electrode N1 is formed on the exposed portion of the n-type semiconductor layer 111. A p-electrode P1 is formed on the p-type semiconductor layer 113.

4-3. Forming Grooves to Isolate Light-Emitting Devices from Each Other

Grooves J1 and J2 are formed as shown in FIGS. 1 and 3. For this, dry etching such as ICP may be used using a mask. Thus, grooves J1 and J2 are formed by partially exposing the base substrate Sa1 (sapphire wafer). These grooves J1 and J2 divide the semiconductor layer 110 into lattices. Thereby, the semiconductor layer 110 is isolated into a plurality of light-emitting devices 100 on the single common base substrate.

4-4. Inspection

Here, a plurality of light-emitting devices 100 formed on the base substrate Sa1 is inspected one by one. In inspection, internal resistance, driving voltage, and total radiant flux are measured. Moreover, reverse current and dominant wavelength are measured.

A light-emitting device 100 having the ratio Y1 within a range of 0.98 or less, or a range of 1.02 or more is detected, i.e., selected. Or, a light-emitting device 100 having the ratio Y2 within a range of 0.98 or less, or a range of 1.02 or more is detected. And, a light-emitting device 100 having the ratio Y3 within a range of 0.98 or less, or a range of 1.02 or more is detected. When the inspection device detects a defective light-emitting device 100 that satisfies at least one or more of the above conditions using the ratios Y1, Y2, and Y3, the coordinates on the base substrate Sa1 of the defective light-emitting device 100 detected are stored in a memory of the inspection device. Needless to say, more than one defective light-emitting device 100 may be detected. The coordinates of the defective light-emitting device 100 detected are transmitted to the wire bonding machine described later. Whether or not the light-emitting device 100 is good may be judged using the ratios Y4 and Y5.

4-5. Electrical Connection

A plurality of light-emitting devices 100 are electrically connected by the wire bonding machine. Here, an n-electrode N1 of one light-emitting device 100 is electrically connected to a p-electrode P1 of a light-emitting device 100 adjacent to the above light-emitting device 100. That is, a connection member 30 is formed.

The wire bonding machine has information about the coordinates on the base substrate Sa1 of the defective light-emitting device 100b. That is, the inspection result is stored in a memory of the wire bonding machine. Therefore, the wire bonding machine connects the n-electrode N1 of the good light-emitting device 100a and the p-electrode P1 of the good light-emitting device 100c by wire bonding to form a connection member 40. At this time, at least one of the n-electrode N1 and the p-electrode P1 of the defective light-emitting device 100b is not connected to the connection members 30 and 40. That is, the defective light-emitting device 100b is not electrically connected to the good light-emitting devices. As a result, the defective light-emitting device 100b does not make a current path in the serial connection body X1. Thus, the light-emitting unit A10 is produced.

4-6. Applying Fluorescent Coating

Fluorescent coating is applied to the light-emitting devices 100 of the light-emitting unit A10. Thus, a fluorescent material 50 is formed so as to cover the entire light-emitting surfaces of the light-emitting devices 100 in the light-emitting apparatus 1.

4-7. Other Steps

In addition to the above-described steps, forming protective film for protecting the light-emitting device 100 and performing thermal treatment may be appropriately carried out. Steps other than the above may be carried out. Thus, the light-emitting apparatus 1 is produced.

5. Comparison Between the Light-Emitting Apparatus According to Embodiment 1 and the Conventional Light-Emitting Apparatus 5-1. Conventional Light-Emitting Device In the conventional light-emitting apparatus, only the good light-emitting devices that satisfied the good electrical characteristics or light-emitting characteristics through the inspection are mounted on a substrate other than a growth substrate, and the good light-emitting devices are connected in series. If even one of the light-emitting devices to be connected in series has a problem in electrical characteristics, other light-emitting devices in a serial circuit do not sufficiently emit a light.

5-2. Light-Emitting Area

Figure 4:
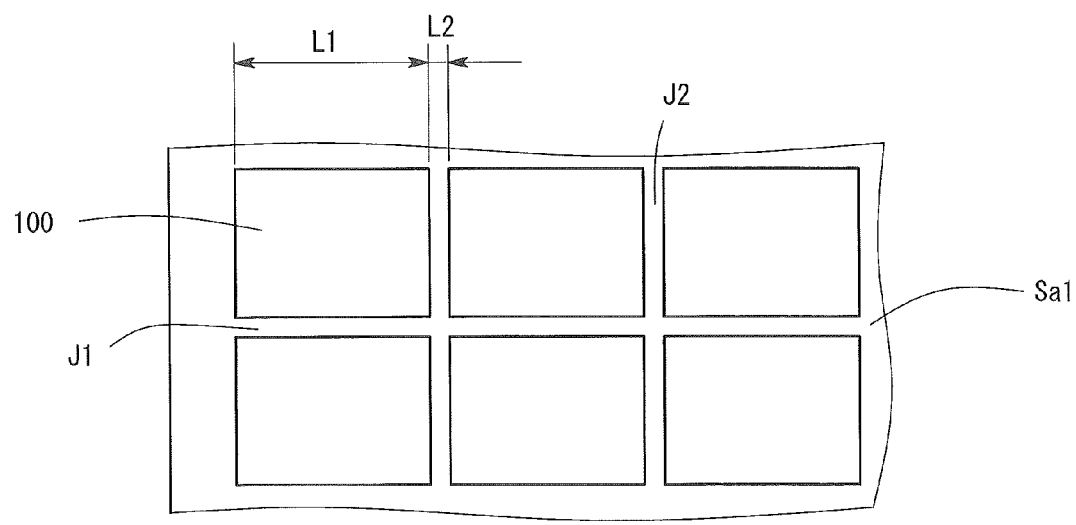
FIG. 4 is a plan view showing the layout of the light-emitting devices in the light-emitting apparatus according to Embodiment 1.

The light-emitting apparatus 1 according to Embodiment 1 and the conventional light-emitting device are compared. Table 1 shows the sizes of the light-emitting apparatus 1 according to Embodiment 1 and the conventional light-emitting apparatus. As shown in FIG. 4, the semiconductor layer 110 is assumed to be square in the light-emitting apparatus 1 according to Embodiment 1 for calculation. A length L1 of one side of the semiconductor layer 110 is 1,000 μm. A length L2 of the grooves between the semiconductor layers 110 in the light-emitting apparatus 1 according to Embodiment 1 is 2 μm.

Figure 5:
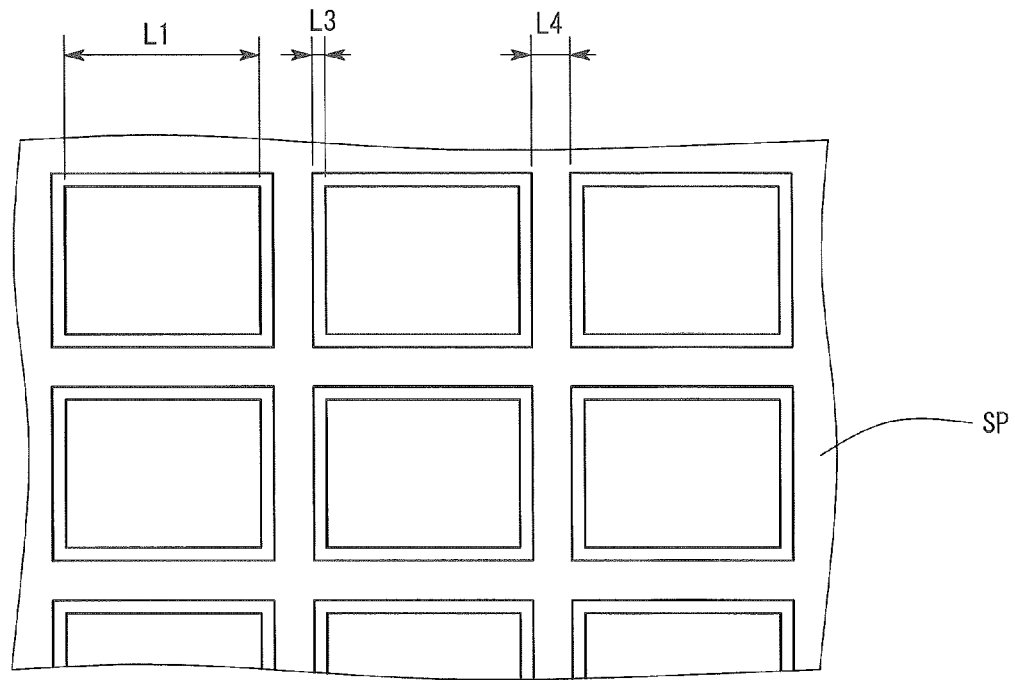
FIG. 5 is a plan view showing the layout of the light-emitting devices in the conventional light-emitting apparatus.

As shown in FIG. 5, the length L1 of one side of the semiconductor layer 110 in the conventional light-emitting apparatus is 1,000 μm. A cutting allowance L3 of the light-emitting device in the conventional light-emitting apparatus is 15 μm. A distance L4 between the light-emitting devices in the conventional light-emitting apparatus is 60 μm.

In Table 1, calculation was made assuming that the light-emitting apparatus 1 has a total hundred light-emitting devices 100 in ten lines and ten rows. However, the area of the base substrate Sa1 in Embodiment 1 is equal to the area of the sapphire substrate SP in the conventional example. As shown in Table 1, the total brightness of the light-emitting apparatus 1 according to Embodiment 1 is improved by 13.5% than that of the conventional light-emitting apparatus.

That is, an effective light-emitting area of the light-emitting apparatus 1 according to Embodiment 1 per unit area of the base substrate Sa1 is larger by 13.5% than that of the conventional light-emitting apparatus per unit area of the base substrate SP. Therefore, when the effective light-emitting area of the light-emitting apparatus 1 according to Embodiment 1 is equal to that of the conventional light-emitting apparatus, the light-emitting apparatus 1 according to Embodiment 1 can reduce the surface area thereof by about 13.5%. This value varies to some extent with the shape or length L1 of one side of the semiconductor layer.

TABLE 1

|  | Light-emitting device according to Embodiment 1 | Conventional light-emitting device |
| --- | --- | --- |
| L1 | 1,000 μm | 1,000 μm |
| L2 | 2 μm | — μm |
| L3 | — μm | 15 μm |
| L4 | — μm | 60 μm |
| Number of light-emitting devices (ratio) | 1.135 | 1.00 |

5-3. Steps

In Embodiment 1, it is not necessary to carry out a step of dividing into light-emitting devices which is conventionally carried out. Or the step can be simplified. Since a step of disposing and fixing a plurality of light-emitting devices on a supporting substrate is not required, the cycle time is short.

5-4. Fluorescent Material

As shown in FIG. 2, a fluorescent material 50 covers at least a part of the surfaces of the light-emitting devices 100. Specifically, the fluorescent material 50 covers the entire light-emitting surfaces of the light-emitting devices 100. When applying the fluorescent coating, the sapphire substrate is not divided although the sapphire substrate was divided in the conventional example, that is, there is no groove or space between adjacent sapphire substrates. Therefore, fluorescent coating does not need to be applied in the groove present in the conventional light-emitting apparatus, and uneven emission color is not caused by the application of fluorescent coating to the side surface of the sapphire substrate. Moreover, it is superior in application and the time required for application is reduced.

6. Effect of Embodiment 1

Thus, in Embodiment 1, no excessive space is not required when disposing the light-emitting devices 100 on the base substrate Sa1, and no cutting allowance is required. Therefore, the light-emission amount per unit area of the light-emitting apparatus 1 according to Embodiment 1 is higher than that of the conventional light-emitting apparatus. In other words, the light-emitting apparatus 1 can be reduced in size. Moreover, the productivity of the light-emitting apparatus 1 can be increased.

7. Variation 7-1. When there is No Defective Light-Emitting Device

Figure 6:
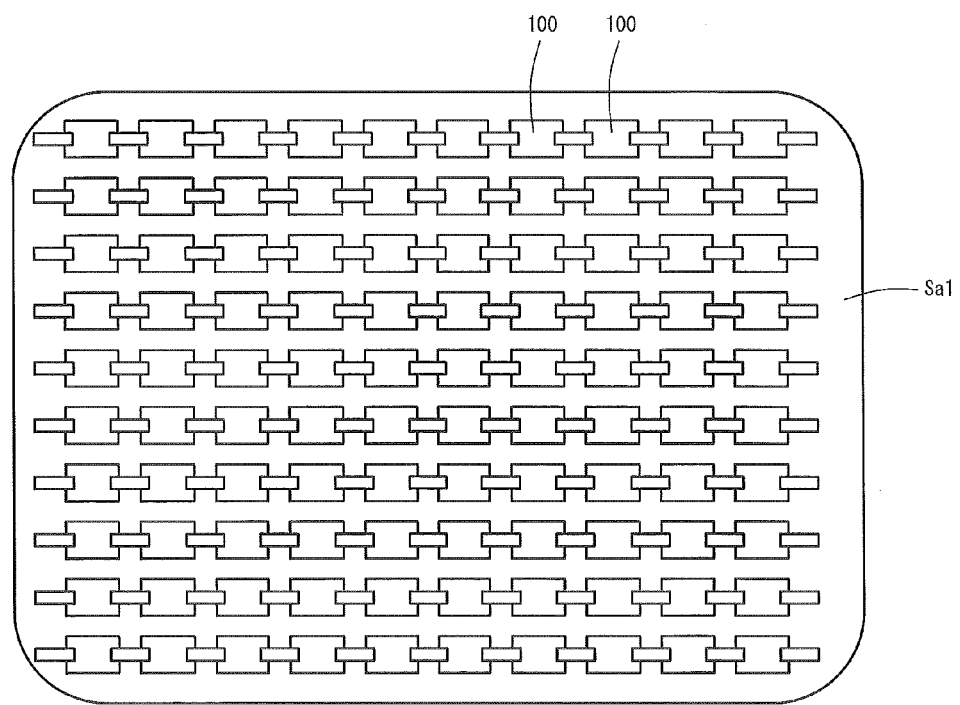
FIG. 6 is a plan view showing a case when there is no light-emitting device with poor electrical characteristics in the light-emitting apparatus according to Embodiment 1.

When the light-emitting apparatus 1 contains no defective light-emitting device 100b having insufficient performance, as shown in FIG. 6, the good light-emitting devices 100 are disposed on one base substrate Sa1. In this case, there is no defective light-emitting device 100b to which an electrical connection should be avoided. Therefore, a plurality of good light-emitting devices 100 is closely disposed on only one base substrate Sa1.

7-2. Number of Serial Connection Bodies and Number of Light-Emitting Devices

The light-emitting unit A10 may have any number of serial connection bodies X1. The number of serial connection bodies may be one or plural. One serial connection body X1 has a plurality of light-emitting devices 100. As long as the number is plural, there may be any number of light-emitting devices. Even in these cases, a plurality of light-emitting devices 100 are disposed on a common single base substrate Sa1 on which a buffer layer 101 is contacted.

7-3. When there is More than One Defective Light-Emitting Device

In FIG. 2, one serial connection body X1 has only one defective light-emitting device 100b that is not electrically connected to other light-emitting device 100. However, one serial connection body X1 may have a plurality of defective light-emitting devices that are not electrically connected to other light-emitting device 100. Moreover, the light-emitting unit A10 may have a plurality of defective light-emitting devices that are not electrically connected to other light-emitting device 100.

7-4. When there is a Defective Light-Emitting Device at One End

Figure 7:
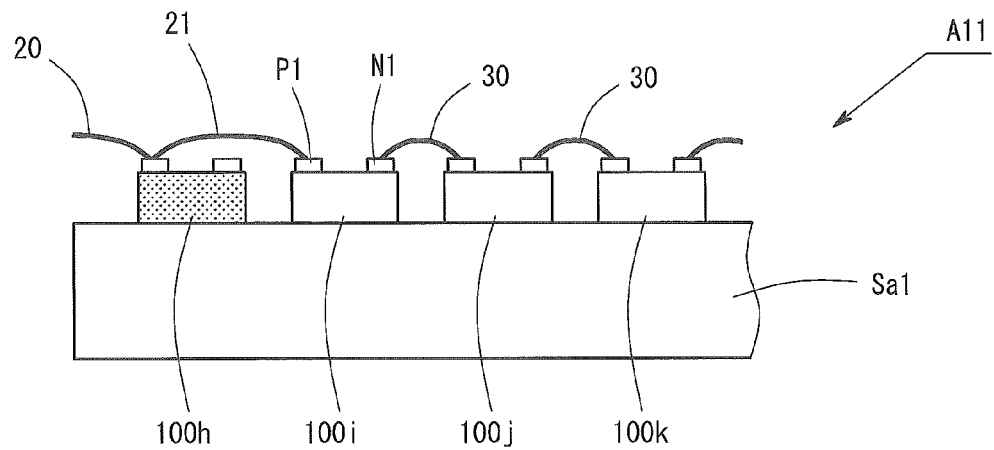
FIG. 7 is a schematic structure diagram of a serial connection body in a light-emitting apparatus according to a variation of Embodiment 1.

In the light-emitting unit A10 according to Embodiment 1, the defective light-emitting device 100b was disposed not at one end of the serial connection body X1. However, as shown in the light-emitting unit A11 of FIG. 7, it may be disposed at one end of the serial connection body X1, In FIG. 7, a light-emitting device 100h is defective. That is, like the light-emitting device 100h, a defective light-emitting device may be disposed at least one end of the serial connection body X1. In this case, a wiring 21 relays the connection of a p-electrode P1 of a good light-emitting device 100i to an external power source.

7-5. n-Electrode and p-Electrode

In Embodiment 1, a first conductive type is n-type, and a second conductive type is a p-type. However, this may be reversed.

7-6. Types of Semiconductors

In Embodiment 1, the semiconductor layer 110 is formed of Group III nitride semiconductor. However, it is not limited to Group III nitride semiconductor, but it may be formed of other semiconductor such as GaAs.

7-7. Unevenness on Substrate

Unevenness may be formed on the base substrate Sa1. In this case, one base substrate Sa1 has one uneven surface, and a plurality of light-emitting devices 100 is disposed on that uneven surface.

7-8. Types of Growth Substrates

A GaN substrate, Sic substrate, and GaAs substrate other than a sapphire wafer may be employed as a growth substrate.

7-9. Threshold

The ratio Y1 of the internal resistance R1 to the internal resistance Rm is within a range of 0.98 or less, or a range of 1.02 or more. However, the ratio Y1 may be within a range of 0.95 or less to 1.05 or more. Similarly, the ratio Y2 may be within a range of 0.95 or less to 1.05 or more. The ratio Y3 may be within a range of 0.95 or less to 1.05 or more.

7-10. Combination

The above variations may be combined with each other.

8. Summary of the Present Embodiment

As described above in detail, in the light-emitting apparatus 1 according to Embodiment 1, a plurality of light-emitting devices 100 is disposed on one base substrate Sa1. This base substrate Sa1 is a growth substrate for these light-emitting devices 100. Therefore, the light-emitting devices 100 can be closely disposed on account of no separation space for the devices. A light-emitting apparatus 1 having a larger light-emission amount per unit area than that of the conventional one, is achieved. Moreover, the light-emitting apparatus 1 can be reduced in size. The cycle time is short, and productivity is increased.

Since the present embodiment is merely an example, it should be understood that those skilled in the art can perform various variations and modifications, without deviating the scope of the present invention. The deposit structure of the semiconductor layer is not necessarily limited to those illustrated. The deposit structure, the number of repetitions of the layers, etc. may be voluntarily determined. The layer formation method is not limited to metal-organic chemical vapor deposition (MOCVD), and any other crystal growth methods may be employed.

Embodiment 2

1. Light-Emitting Apparatus and Light-Emitting Unit

Embodiment 2 will now be described. A light-emitting apparatus according to Embodiment 2 has a light-emitting unit A20 shown in FIG. 8. The light-emitting unit A20 according to Embodiment 2 is almost same as the light-emitting unit A10 according to Embodiment 1. However, the light-emitting unit A20 according to Embodiment 2 has a conductive member 230 in addition to the structure of the light-emitting unit A10 according to Embodiment 1.

The conductive member 230 electrically connects the p-electrode P1 and the n-electrode N1 of the defective light-emitting device 100b. In other words, the p-electrode P1 and the n-electrode N1 of the defective light-emitting device 100b are short-circuited. Therefore, even if a current flows to the light-emitting unit A20, the current hardly flows inside the defective light-emitting device 100b, i.e., to the semiconductor layer. The defective light-emitting device 100b does not make a current path. Needless to say, the defective light-emitting device 100b does not emit light.

Figure 8:
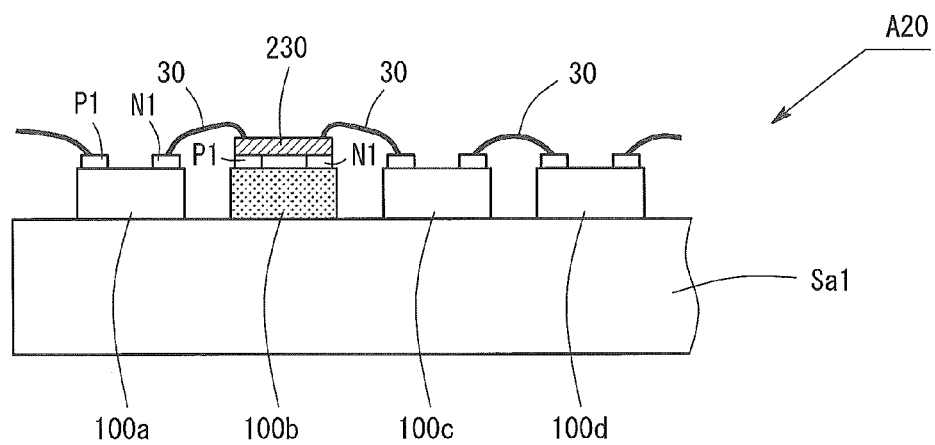
FIG. 8 is a schematic structure diagram of a light-emitting apparatus according to Embodiment 2.

Thus, current hardly flows to the defective light-emitting device 100b. Therefore, as shown in FIG. 8, the number of light-emitting devices which emit light is smaller by one than the number of light-emitting devices in the light-emitting unit A20. However, the light-emitting devices 100 other than 100b emit light, and a higher voltage is applied to the respective good light-emitting device 100. Therefore, only the light-emission amount reduced by the defective light-emitting device 100b which does not emit light can be compensated to a certain extent. Needless to say, it is similar even when there is more than one defective light-emitting device 100b having a high resistance value. However, a yield of the light-emitting device 100 is above a certain level, and actually the light-emitting unit A20 rarely has more than one defective light-emitting device 100b. A light-emitting apparatus comprises the light-emitting unit A20 as shown in FIG. 8 and the fluorescent material which covers the entire light-emitting surfaces of the light-emitting devices 100a to 100d, etc. like as shown in FIG. 2.

2. Production Method for Light-Emitting Apparatus

The production method for the light-emitting apparatus 2 according to Embodiment 2 is different in connection step from the production method for the light-emitting apparatus 1 according to Embodiment 1. Therefore, different connecting step will be described below.

2-1. Connecting Step

In the present embodiment, when a p-electrode and an n-electrode of the adjacent light-emitting devices 100 are connected by wire bonding, a p-electrode and an n-electrode of a defective light-emitting device 100b are electrically connected by a conductive member 230. FIG. 8 shows the case where the conductive member 230 is formed between the p-electrode P1 and the n-electrode N1 of the defective light-emitting device 100b. As shown in FIG. 8, after the formation of the conductive member 230, light-emitting devices 100 are connected by wire bonding. However, after the adjacent light-emitting devices 100 are electrically connected by wire bonding, the conductive member 230 may be formed.

3. Variation 3-1. Conductive Member

Figure 9:
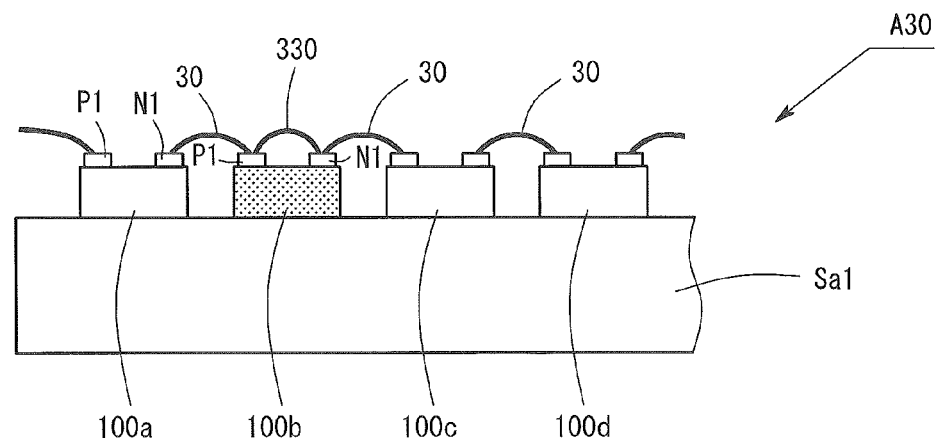
FIG. 9 is a schematic structure diagram of a light-emitting apparatus according to a variation of Embodiment 2.

As shown in FIG. 9, a light-emitting unit A30 may have a connection member 330. The connection member 330 is a conductive member to electrically connect a p-electrode P1 and an n-electrode N1 by wire bonding. Therefore, similarly as in the present embodiment, a current does not flow to the defective light-emitting device 100b.

Embodiment 3

Embodiment 3 will be described below. A light-emitting unit A40 according to Embodiment 3 has flip-chip type light-emitting devices 400.

1. Light-Emitting Apparatus and Light-Emitting Unit

Figure 10:
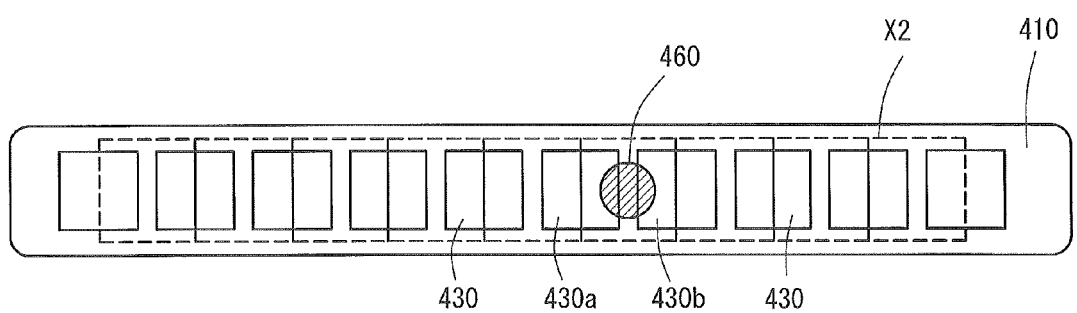
FIG. 10 is a plan view showing a light-emitting apparatus according to Embodiment 3.
Figure 11:
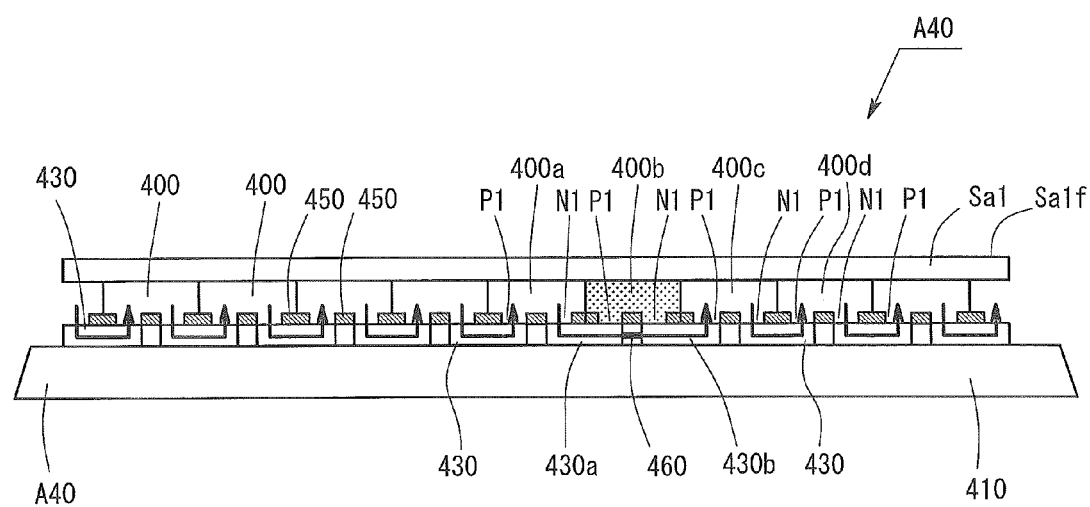
FIG. 11 is a schematic structure diagram of the light-emitting apparatus according to Embodiment 3.

FIG. 10 is a plan view showing a sub-mount (supporting substrate) 410 to which a serial connection body X2 is connected. FIG. 11 is a schematic structure diagram of the light-emitting unit A40 which is obtained by connecting the serial connection body X2 to the sub-mount 410, viewed from the side. The light-emitting unit A40 comprises a base substrate (growth substrate) Sa1, a light-emitting device 400, an insulation film 450, a sub-mount 410, a land (a connection member) 430 disposed on the sub-mount 410, and a conductive member 460. The insulation film 450 covers surfaces of light-emitting devices 400 other than surfaces of an n-electrode N1 and a p-electrode P1. In this Embodiment, the n-electrode N1 and the p-electrode P1 are formed in a rectangle shape. The land 430 is formed on the sub-mount 410 in a rectangle shape. A p-electrode P1 of a good light-emitting device 400c and an n-electrode N1 of a next good light-emitting device 400d are connected face down to the land 430. The other good light-emitting devices are electrically connected to the lands as in a same way.

The land (connection member) 430 is to electrically connect a n-electrode N1 of one good light-emitting device 400 and an p-electrode P1 of a good light-emitting device 400 adjacent to the above good light-emitting device 400.

The conductive member 460 is to electrically connect lands 430a and 430b which are connected to respectively a p-electrode P1 and an n-electrode N1 of a defective light-emitting device 400b. The conductive member 460 and the lands 430 are formed of metal paste, for example, Au paste, Ag paste, Au nano paste, AuSn paste, and SnAgCu paste. Other metal conductive member may be employed.

Therefore, a current flows from the good light-emitting device 400a to the good light-emitting device 400c. No current flows to the defective light-emitting device 400b by a short circuit between the connect lands 430a and 430b through the conductive member 460. Thus, the light-emitting unit A40 is achieved, in which a current flows to the good light-emitting devices other than the defective light-emitting device 400b. A light-emitting apparatus comprises the light-emitting unit A40 as shown in FIG. 11 and the fluorescent material which covers an entire light-output surface Sa1f of the base substrate Sa1, i.e., a front surface Sa1f of the transparent sapphire substrate Sa1 from which a emitted light is output.

2. Production Method for Light-Emitting Apparatus

The production method of Embodiment 3 includes a step of mounting the above light-emitting unit A40 face down on the sub-mount 410. In other respects, the production method is almost same as that of other embodiments.

A. Supplementary Information

The light-emitting part includes a single base substrate and a plurality of light-emitting devices on the single base substrate. The light-emitting part includes a serial connection body in which at least a part of light-emitting devices are connected in series. A plurality of light-emitting devices comprises a semiconductor layer comprising a first conductive type first semiconductor layer, a light-emitting layer, and a second conductive type second semiconductor layer; a first electrode electrically connected to the first semiconductor layer; and a second electrode electrically connected to the second semiconductor layer. The serial connection body includes a connection member which electrically connects a first electrode of the first light-emitting device, and a second electrode of the second light-emitting device. The single base substrate is a growth substrate for growing semiconductor layers of the light-emitting devices. The light-emitting devices are disposed on the growth substrate on which a buffer layer is contacted.

What is claimed is:

1. A light-emitting apparatus comprising:
a single growth sapphire substrate on an entire main surface of which Group III nitride semiconductor layers are grown;
a plurality of light-emitting devices comprising the Group III nitride semiconductor layers on the growth sapphire substrate, each of the light-emitting devices comprising a buffer layer, a first conductive type first semiconductor layer, a light-emitting layer, a second conductive type second semiconductor layer, a first electrode electrically connected to the first semiconductor layer, and a second electrode electrically connected to the second semiconductor layer, wherein the first electrode and the second electrode are formed on a same side of the light-emitting device, and
a fluorescent material which covers a surfaces of the light-emitting devices;
wherein each of the light-emitting devices are isolated from each other by a groove formed on the main surface of the growth sapphire substrate,
wherein the light-emitting apparatus comprises:
a plurality of good light-emitting devices which make a current path to emit a light;
a defective light-emitting device which does not make the current path not to emit a light, the defective light-emitting device existing between the plurality of good light-emitting devices;
a bonding wire for adjacent connection which electrically connects the first electrode of a good light-emitting device of the plurality of good light-emitting devices, and the second electrode of an other good light-emitting device of the plurality of good light-emitting devices, which is adjacent to the good light-emitting device; and a bonding wire for bypass connection which electrically connects the first electrode of a left side good light-emitting device which is on a left side of the defective light-emitting device and the second electrode of a right side good light-emitting device which is on a right side of the defective light-emitting device with bypassing the first and second electrodes of the defective light-emitting device; and wherein a serial connection circuit of some of the good light-emitting devices is formed by the bonding wire for adjacent connection and the bonding wire for bypass connection.

2. The light-emitting apparatus according to claim 1, wherein a ratio of internal resistance of the defective light-emitting device to an average internal resistance of the good light-emitting devices in the serial connection circuit is within a range of 0.98 or less, or a range of 1.02 or more.

3. The light-emitting apparatus according to claim 1, wherein a ratio of a driving voltage of the defective light-emitting device to an average driving voltage of the good light-emitting devices in the serial connection circuit is within a range of 0.98 or less, or a range of 1.02 or more.

4. The light-emitting apparatus according to claim 1, wherein a ratio of a total radiant flux of the defective light-emitting device to an average total radiant flux of the good light-emitting devices in the serial connection circuit is within a range of 0.98 or less, or a range of 1.02 or more.

5. A light-emitting apparatus comprising:
a single growth substrate on an entire main surface of which Group III nitride semiconductor layers are grown; and a plurality of flip-chip type light-emitting devices comprising the Group III nitride semiconductor layers on the growth substrate, each of the light-emitting devices comprising a first conductive type first semiconductor layer, a light-emitting layer, a second conductive type second semiconductor layer, a first electrode electrically connected to the first semiconductor layer, and a second electrode electrically connected to the second semiconductor layer, wherein the first electrode and the second electrode are formed on a same side of the light-emitting device, wherein:
each of the light-emitting devices are isolated from each other by a groove formed on the main surface of the growth substrate, and the light-emitting apparatus comprises:
good light-emitting devices which make a current path to emit a light;

a defective light-emitting device which does not make the current path not to emit a light, the defective light-emitting device existing between the two good light-emitting devices;

a sub-mount comprising a plurality of conductive lands disposed thereon, the conductive land comprising a first area connected to which the first electrode of one of the light-emitting device is connected face down and a second area to which the second electrode of other light-emitting device adjacent to the former light-emitting device is connected face down; and a conductive member disposed on and electrically connecting adjacent two conductive lands to which the first electrode and the second electrode of the defective light-emitting device, respectively.

6. The light-emitting apparatus according to claim 5, wherein a ratio of internal resistance of the defective light-emitting device to an average internal resistance of the good light-emitting devices in the serial connection circuit is within a range of 0.98 or less, or a range of 1.02 or more.

7. The light-emitting apparatus according to claim 5, wherein a ratio of a driving voltage of the defective light-emitting device to an average driving voltage of the good light-emitting devices in the serial connection circuit is within a range of 0.98 or less, or a range of 1.02 or more.

8. The light-emitting apparatus according to claim 5, wherein a ratio of a total radiant flux of the defective light-emitting device to an average total radiant flux of the good light-emitting devices in the serial connection circuit is within a range of 0.98 or less, or a range of 1.02 or more.

9. The light-emitting apparatus according to claim 5, comprising a fluorescent material which covers an entire light-output surface of the growth substrate.

* * * * *